United States Patent [19]
Farmer

[11] Patent Number: 5,628,196
[45] Date of Patent: May 13, 1997

[54] CRYOGENIC COOLING APPARATUS EMPLOYING HEAT SINK AND DIFFUSER PLATE FOR COOLING SMALL OBJECTS

[75] Inventor: Roger C. Farmer, Arcadia, Calif.

[73] Assignee: Loral Electro-Optical Systems, Inc., Pasadena, Calif.

[21] Appl. No.: 563,281

[22] Filed: Nov. 22, 1995

[51] Int. Cl.$^6$ .................................................. F25B 19/00
[52] U.S. Cl. ............................ 62/51.1; 62/259.2; 372/36
[58] Field of Search ............................... 62/51.1, 259.2; 372/36

[56] References Cited

U.S. PATENT DOCUMENTS

| | | | |
|---|---|---|---|
| 3,188,830 | 6/1965 | Cowans | 62/259.2 |
| 3,379,032 | 4/1968 | Wilson | 62/259.2 |
| 4,092,614 | 5/1978 | Sakuma et al. | 372/36 |
| 4,210,878 | 7/1980 | Yonezu | 372/49 |
| 4,360,965 | 11/1982 | Fujiwara | 29/582 |
| 4,873,843 | 10/1989 | Volten | 62/51.1 |
| 5,111,050 | 5/1992 | Maassen et al. | 62/51.1 X |
| 5,260,575 | 11/1993 | Iwasaki et al. | 62/51.1 X |
| 5,432,535 | 7/1995 | Andrews et al. | 347/242 |
| 5,454,002 | 9/1995 | McCann | 372/36 |

*Primary Examiner*—Christopher Kilner
*Attorney, Agent, or Firm*—Perman & Green

[57] ABSTRACT

Cooling apparatus has a cryogenic cooler which is connected thermally by a heat transfer system to a hot object to be cooled, wherein the heat transfer system is constructed of a cold finger, a heat sink or energy control module, and a thermal diffuser. The cold finger thermally connects the heat sink to the cooler, and the diffuser thermally connects the hot object to the heat sink. The heat sink is formed of a thermally conductive material, preferably lithium which has a high energy storage capacity, and which is enclosed within a housing of thermally conductive material to prevent interaction of the lithium chemically with the external environment. The diffuser is fabricated of solid industrial diamond which has great thermal diffusivity at cryogenic temperatures to distribute, virtually instantaneously, and over a wide area of the heat sink much larger than the hot object, the energy dissipated within the hot object. In the case wherein the hot object is a semiconductor laser, the material of the lasing medium is contiguous the diffuser, the diffuser extending well beyond the semiconductor material to provide a wide and highly conductive thermal path from the laser to the heat sink. A vacuum-tight housing, having one or more windows transparent to radiation, encloses the laser, the heat sink, and the cold finger to provide thermal insulation and prevent contamination of the laser from an external environment.

8 Claims, 2 Drawing Sheets

1

CRYOGENIC COOLING APPARATUS EMPLOYING HEAT SINK AND DIFFUSER PLATE FOR COOLING SMALL OBJECTS

BACKGROUND OF THE INVENTION

This invention relates to cryogenic cooling apparatus and, more particularly, to cooling apparatus having a heat sink of thermally conductive material which has a relatively high specific heat for storage of thermal energy, wherein the heat sink is connectable by a diffuser plate of low specific heat and high diffusivity to a relatively small hot object which is to be cooled.

There are numerous situations where a hot small object is to be cooled by apparatus which is much larger physically than the object to be cooled. One situation of particular interest is the cooling of a semiconductor laser. A particular application of the cooling apparatus applies to a semiconductor laser used to radiate high power in a military situation. Therefore, while it is to be understood that the cooling apparatus of the present invention is applicable for cooling many types of hot objects, it is advantageous to show use of the cooling apparatus in the miltary situation which will now be described.

Jamming of an infrared heat seeking missile, for the purpose of protecting a friendly aircraft, has been accomplished by transmitting a beam of infrared radiation wherein the radiation amplitude is modulated in the manner of a train of pulses. Such a beam of amplitude modulated, or chopped, radiation is directed at the missile. As is well known, such missiles have a detector assembly which responds to incident radiation to produce a detected signal. The missiles are operative to detect a direction of incident radiation of substantially constant amplitude by a process of chopping the detected signal to gain phase data which directs the missile in the azimuthal and the elevation coordinates for tracking a source of the radiation. The presence of a jamming chopped infrared signal introduces additional pulses to the missile's detected signal resulting in the development of directional errors which drive the missile off course.

A problem arises with the use of cryogrenic cooling apparatus of the prior art in that such apparatus has significant weight which reduces the flight capabilities of an aircraft. A further aspect of the problem of presently available cryogenic cooling apparatus is that the apparatus is physically much larger than a relatively small semiconductor laser which is to be cooled. As a result, inefficiencies exist in the transference of heat from the small hot object to the large cooling apparatus.

SUMMARY OF THE INVENTION

The foregoing problem is overcome and other advantages are provided by a cryogenic cooler connected thermally by a heat transfer system to a hot object to be cooled wherein, in accordance with the invention, the heat transfer system comprises a cold finger, a heat sink or energy control module, and a thermal diffuser. The cold finger thermally connects the heat sink to the cooler, and the diffuser thermally connects the hot object to the heat sink. The heat sink comprises lithium which has a high energy storage capacity, more than seven times that of copper. Therefore, lithium makes a far superior heat sink than would a block of copper. The lithium is enclosed within a housing of thermally conductive material to prevent interaction of the lithium chemically with the external environment. The diffuser is fabricated of solid industrial diamond which has the unique property of almost infinite thermal diffusivity at cryogenic temperatures, greater than that of copper by approximately a factor of 1,000. The effect of emplacement of the diffuser between the hot object and the heat sink is to distribute, virtually instantaneously, and over a wide area of the heat sink much larger than the hot object, the energy dissipated within the hot object.

Diamond has almost zero energy storage at the cryogenic temperatures, this facilitating its function of spreading the energy over a large area of the surface of the lithium heat sink. In the case wherein the hot object is a semiconductor laser which must be kept cool in order to operate properly, the diffuser is in the form of a plate which abuts the laser chip or slab of semiconductor material, and extends well beyond the semiconductor material to provide a wide and highly conductive thermal path from the laser to the heat sink. Thereby, pulses of heat, produced by the laser during a generation of radiation pulses, can be extracted by the heat sink well before an occurrence of a following pulse and stored in the heat sink during a withdrawal of the heat energy from the heat sink via the cold finger to the cryogenic cooler.

BRIEF DESCRIPTION OF THE DRAWINGS

The aforementioned aspects and other features of the invention are explained in the following description, taken in connection with the accompanying drawing figures wherein.

Identically labeled elements appearing in different ones of the figures refer to the same element in the different figures but may not be referenced in the description for all figures.

DETAILED DESCRIPTION

To facilitate description of the cooling apparatus of the invention, reference will be made first, in FIGS. 1-3, to the construction of a semiconductor laser emitter of radiation for jamming an approaching missile. Such a laser could not be operated to its full effectiveness without a cooling system which is capable of rapid withdrawal of heat to retain laser temperature within a desired operating range. The cooling apparatus of the present invention is ideally suited for this assignment.

Figure 1:
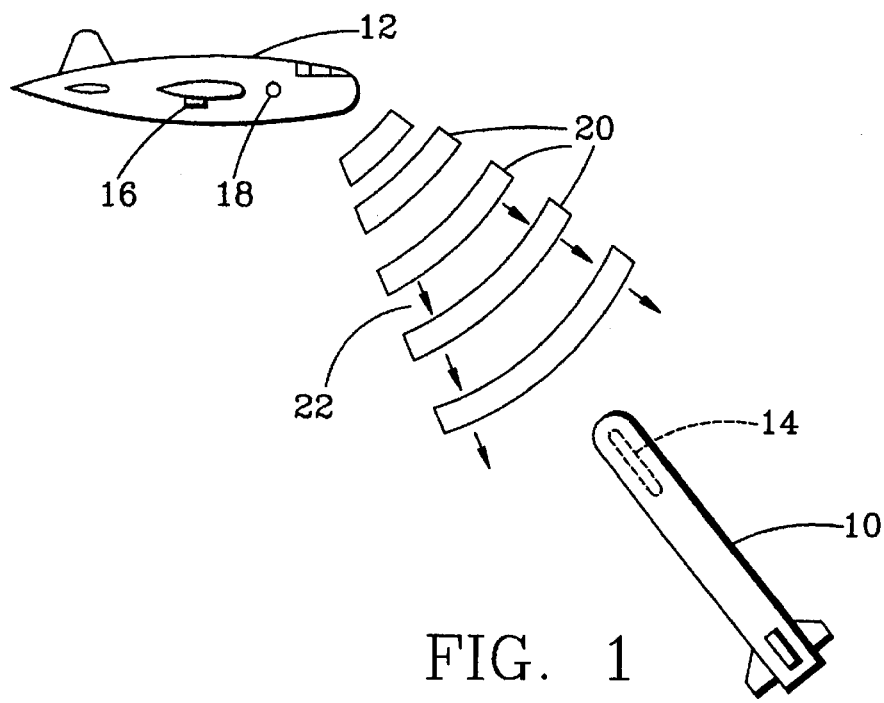
FIG. 1 shows a stylized view of an aircraft jamming an approaching missile by use of a pulsed beam of infrared radiation.

FIG. 1 presents a countermeasures situation wherein a missile 10 attacks an aircraft 12. The missile 10 has a detector assembly 14 which is responsive to infrared radiation in the mid-infrared region having a wavelength in the range of typically 3-5 microns. The aircraft 12 has jet engines 16, one of which is shown, which emit radiation in the foregoing mid-infrared region. As the missile 10 approaches the aircraft 12, the detector assembly 14 detects the infrared radiation emitted by the aircraft engines 16. The detector assembly 14 develops azimuth and elevation error signals which direct the missile toward the aircraft 12. Operation of the detector assembly 14 is based on reception of radiation of substantially constant intensity followed by a chopping of the detected signal to develop phase data for providing the azimuth and the elevation signals.

The aircraft 12 carries an infrared countermeasures unit 18 which emits a sequence of pulses 20 of radiation in a diverging beam 22, the radiation pulses being in the aforementioned mid-infrared region. The pulse duty cycle is in the range of approximately 2–25 per cent. The pulses 20 of the radiation are detected by the missile detector assembly 14 and interact with the chopping pulses to introduce errors in the missile azimuth and elevation signals. The erroneous azimuth and elevation signals direct the missile 10 away from the aircraft 12 resulting in a successful countermeasures operation wherein the aircraft 12 has been saved from the attack of the missile 10.

Figure 2:
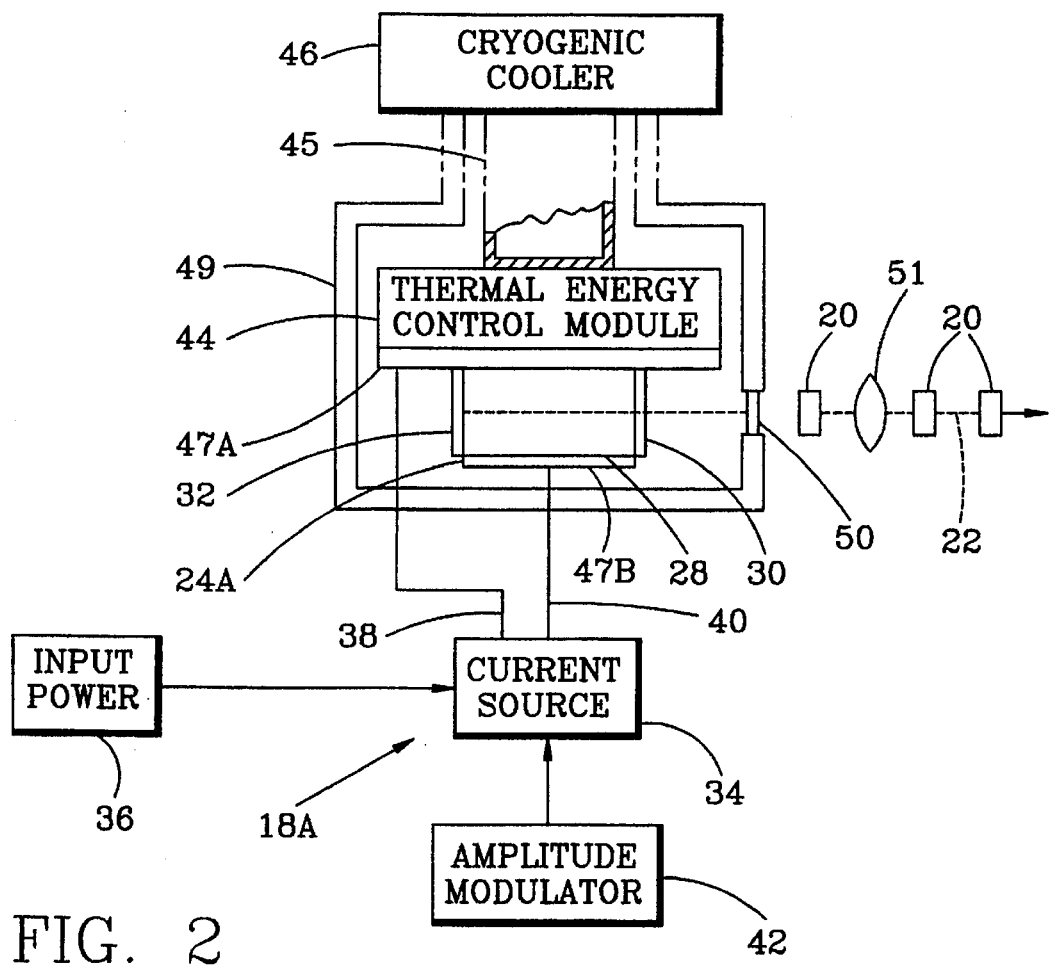
FIG. 2 is a diagram of a semiconductor laser emitter with associated optics and electrical excitation power for a laser of semiconductor material doped to form a p/n junction.

FIG. 2 shows a countermeasures unit 18A constructed in accordance with a first embodiment of the countermeasures unit 18 of FIG. 1. In FIG. 2, the countermeasures unit 18A comprises a laser 24A which emits the pulses 20 of radiation of the beam 22. The lasing medium of the laser 24A comprises a semiconductor material which is doped to have a p/n junction constituting a diode. The lasing medium of the laser 24A is a solid semiconductor slab 28 which has opposed end mirrors 30 and 32 disposed on opposed end facets of the slab 28. The mirror 30 is a front mirror and the mirror 32 is a back mirror. Upon excitation of the laser slab 28 electrically with current from a current source 34, the laser slab 28 emits the infrared radiation. The radiation is reflected back and forth between the end mirrors 30 and 32 to build up to a desired level of radiation intensity. The mirrors 30 and 32 may be formed of layers of a reflecting metal such as gold or silver, wherein the layer of the front mirror 30 is thinner than the layer of the back mirror 32 to allow exit of the beam 22 from the front mirror 30.

The current source 34 receives input electric power from a power supply 36. Current outputted from the current source 34 to the slab 28, via wires 38 and 40, is modulated in amplitude by a modulator 42 to provide pulses of the current to the diode 26. The pulsing of the current to the slab 28 results in a pulsing of the radiation emitted by the lasing medium, and a formation of a series of the radiation pulses 20 transmitted to the missile 10 (FIG. 1). Also included within the countermeasures unit 18A is a thermal energy control module 44, a cold finger 45 (shown partially sectioned), and a cryogenic cooler 46. The module 44 is in thermal contact with the laser 24A for withdrawing, in the manner of a heat sink, heat dissipated by the laser 24A. The heat is produced by the flow of the electric current through the slab 28. The cooler 46 withdraws heat from the module 44, via the cold finger 45, by cooling the module 44 and, thereby, discharges the heat of the diode 26 to the environment external to the countermeasures unit 18A.

The module 44 has an electrically conductive surface which abuts one face of the slab 28 to serve as an electrode 47A by which the wire 38 makes electrical contact with the slab 28. An opposite face of the slab 28 is made into an ohmic contact 37B by which the wire 40 makes electrical contact with the slab 28. A vacuum chamber 49 is formed by a vacuum-tight housing which encloses the laser 24A and the module 44 and the cold finger 45. The chamber 49 thermally insulates the laser 24A from the outside environment for maintenance of a cryogenic temperature, and also protects the laser 24A from contamination by the external environment as well as from the formation of moisture and/or ice on the laser 24A. A housing wall of the chamber 49 includes a window 50 which is transparent to the infrared radiation emitted by the laser 24A to allow exit of the beam 22. A lens 51 collimates the radiation emitted by the laser 24A to form the beam 22 with a narrow beam width of approximately a few milliradians so as to provide adequate jamming signal strength at distances on the order of many miles from the countermeasures unit 18A (FIG. 1). The lens 51 is representative of a lens assembly which may include a cylindrical or barrel lens element for a more accurate collimation of the radiation which is emitted by the laser 24A with different dispersion angles in different orthogonal planes. Not shown in the figures but included within the countermeasures unit 18A is a well known guidance system for pointing the beam 22 toward the missile 10 (FIG. 1).

The laser 24A of FIG. 2 may be constructed of a lead chalcogenide or a III-V compound of semiconductor material having a p/n junction for formation of a diode. In the case of the lead chalcogenide laser diodes, such laser diodes are characteristically formed from $Pb_{1-x}Se_x$ or $Pb_{1-x}Sn_xSe$ compounds. These compounds operate at cryogenic temperatures and have relatively low output power. They are commercially available from at least two manufacturers. Radiation wavelength in the mid-infrared region is available. The material of the lasing medium of the laser 24A requires an operating temperature less than approximately 125 degrees Kelvin. The cooling apparatus, including the module 44 and the cold finger 45 and the cooler 46, is operative to reduce the temperature of the lasing medium to approximately 50 degrees Kelvin between the laser radiation pulses 20, while allowing the temperature to rise up to approximately 90 degrees Kelvin during a laser radiation pulse 20 for a nominal values of the radiation pulse duration and duty cycle.

The III-V compounds for semiconductor laser diodes characteristically have active layers formed of $Ga_{0.84}In_{0.16}As_{0.14}Sb_{0.86}$, and are capable of high power output which is greater than that of laser diodes. However, this material has very high series resistance and generates large amounts of heating on passage of electric current through the material. When operated at cryogenic temperatures, this material necessitates use of very large and expensive cooling apparatus in order to make available the full power capability. Nevertheless, such device with its cooling apparatus would be suitable for small to medium sized aircraft for performing the countermeasure function. The laser material of the III-V compounds is also available commercially.

Figure 3:
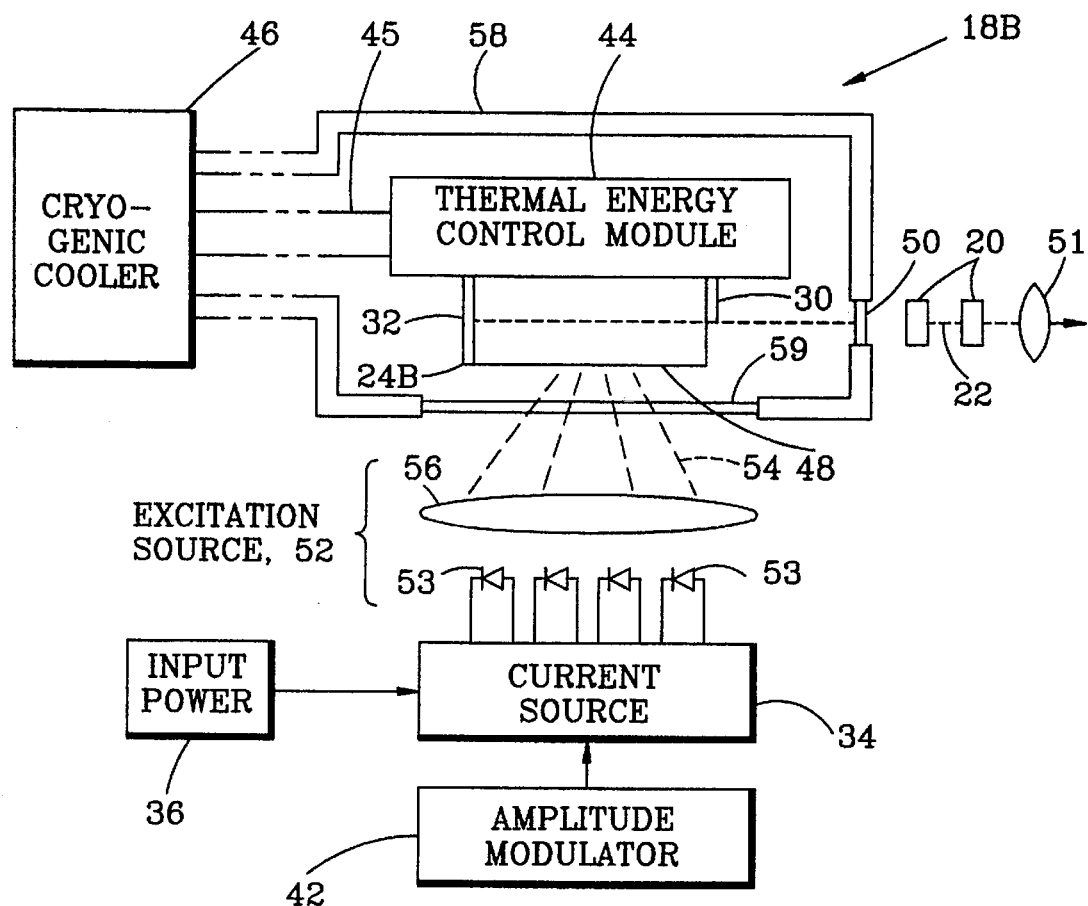
FIG. 3 is a diagram of a semiconductor laser emitter with associated optics and electrical circuitry for optical excitation of a laser of uniform undoped semiconductor material.

FIG. 3 shows a countermeasures unit 18B constructed in accordance with a second embodiment of the countermeasures unit 18 of FIG. 1. In FIG. 3, the countermeasures unit 18B is seen to comprise much of the equipment shown previously in FIG. 2 for the countermeasures unit 18A. Thus, both the units 18A and 18B include the thermal energy control module 44, the cold finger 45 and the cryogenic cooler 46, as well as the current source 34, the power supply 36, and the amplitude modulator 42. The countermeasures unit 18B further comprises a laser 24B which differs in its construction from the laser 24A. The laser 24B includes a slab 48 of uniform undoped semiconductor material, and supports the front mirror 30 and the back mirror 32 described previously in the construction of the laser 24A of FIG. 2. Since the material of the slab 48 is undoped, there is no p/n junction. Accordingly, excitation of the lasing medium is accomplished by an optical excitation source 52 rather than by use of the electrical excitation disclosed in FIG. 2.

As shown in FIG. 3, the excitation source 52 comprises a source of excitation radiation, such as a set of laser diodes 53 which are electrically excited by current from the current source 34 to emit radiation 54 to the slab 48. The radiation 54 is focused by an optical element represented in FIG. 3 as a converging lens 56. The lens 56 is representative of a lens assembly which may include a cylindrical or barrel lens for focussing radiation from a line array of the diodes 53 upon the laser slab 48, and for illuminating the entire length of the slab 48. Typically the footprint of the radiation 54 upon the slab 48 would measure a few millimeters (mm) in length, between the mirrors 30 and 32, and be relatively narrow in the transverse direction to have a width in the range of 0.1 to 0.5 mm. Also included in the countermeasures unit 18B is a vacuum chamber 58 which encloses the laser 24B, the module 44 and the cold finger 45. The chamber 58 is functionally equivalent to the vacuum chamber 49 (FIG. 2) but has two windows rather than the single window of the chamber 49. The first of the two windows of the chamber 58 is the window 50 in front of the laser 24B providing access to the beam 22 emitted by the laser 24B, and the second of the two windows is a window 59 at the side of the laser 24B for admitting the radiation 54 from the set of diodes 53. The lens 51 serves to collimate the beam 22 from the laser 24B in the same fashion as described above for the collimation of the beam 22 from the laser 24A.

Upon excitation of the semiconductor material of the slab 48 to emit radiation, the laser 24B functions in a manner analogous to that of the laser 24A (FIG. 2) to emit the infrared beam 22. Upon a pulsing of the current of the source 34 by the modulator 42, the source 34 applies the pulsed current to the diodes 53 which, in turn, emit pulses of the excitation radiation to the slab 48, this resulting in the emission of the radiation pulses 20 from the laser 24B. In order to excite the material of the slab 48, the frequency of the excitation radiation 54 is greater than the frequency of the emitted radiation 22, as is well known. The wavelength of the excitation radiation is in the range of 0.94–0.97 microns, this being substantially less than the output radiation wavelength, approximately 4 microns, of the laser 24B.

Figure 4:
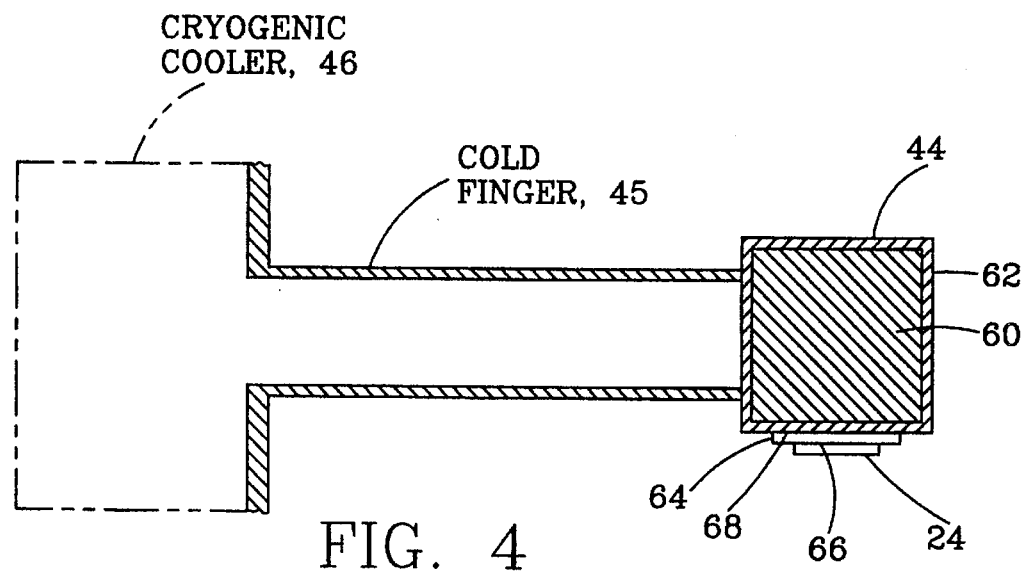
FIG. 4 is a diagram showing support of a semiconductor laser by cryogenic equipment for extraction of heat to maintain laser operating temperature.

The laser 24B of FIG. 3 employs the same III-V compound as does the laser diode 24A except that, in the case of the laser 24B there is no doping of the material for production of a p/n junction. The laser 24B as noted hereinabove, employs the optical excitation instead of the electrical excitation of the laser 24A, the optical excitation reducing the heating losses associated with electrical excitation currents by almost two orders of magnitude. This factor, combined with the thermal energy storage technique, to be described with reference to FIG. 4, provides for a residual heat dissipation useful for low duty cycle jamming technology. In the case of the laser 24A employing the electrical excitation, the current source 34 provides approximately a few amperes, with a wide range of jamming modulations at modulation frequencies ranging from 50 Hz to 40 KHz. In the case of the set of laser diodes 53 (FIG. 3) for the optical excitation, these laser diodes operate at room temperature. The current source 34 provides current, typically on the order of 100 amperes, for operation of the laser diodes 53 for excitation of the jamming laser 24B.

FIG. 4 shows interconnection of the cryogenic cooler 46 to the energy control module 44 by means of a cold finger 45. A laser 24 is supported by the module 44, and is in thermal contact with the module 44. The laser 24 is a semiconductor laser and may be constructed in accordance with the construction of either of the laser embodiments 24A or 24B, as described above with reference to FIGS. 2 and 3. Each of the laser slabs 28 and 48 has dimensions, typically of 2 millimeters (mm) in width, 3 mm in length, and 0.1 mm in thickness. The cold finger 45 and the module 44 are composed of thermally conducting metal, and are shown in cross-sectional view to facilitate an understanding of their construction. The module 44 comprises a heat sink 60 enclosed within a housing 62. The housing 62 of the module 44 connects directly with the cold finger 45, and connects via a diffuser 64 to the laser 24. The diffuser 64 has the configuration of a plate which is larger than a corresponding mating surface of the laser 24 so as to diffuse heat emitted by the laser 24 over a region of the module 44 which is substantially larger than the mating surface of the laser 24.

FIG. 4 has been simplified by elimination of the sources of excitation of the laser 24. In the event that the laser 24 is constructed as the laser 24A of FIG. 2, then it is understood that the electric wires 38 and 40 are to be connected to the laser 24. In the event that the laser 24 is to be constructed as the laser 24B of FIG. 3, then it is to be understood that the excitation source 52 is to be positioned for directing the radiation 54 toward the laser 24. In the operation of the energy control module 44, the heat sink 60 comprises lithium. Lithium has a high energy storage capacity. By way of example, the thermal energy storage capacity of lithium is over seven times that of copper at cryogenic temperatures. Therefore, lithium makes a far superior heat sink than would a block of copper or other metal or thermal conductor. However, lithium is relatively reactive with many chemical compounds, and ignites spontaneously in air at slightly above its melting point of 180° centigrade. Accordingly, the lithium of the heat sink 60 is enclosed within the housing 62 which protects the lithium from the atmosphere. The housing 62 is composed of a thermally conductive metal, such as copper or aluminum or magnesium, which do not react with the lithium. Magnesium has the highest thermal energy storage of the three metals, but not as high as the thermal energy storage of lithium. The walls of the housing 62 are sufficiently thin so as to offer little thermal resistance to the flow of heat, while being sufficiently strong to protect the lithium and to support the lithium at the end of the cold finger 58.

The diffuser 64 is fabricated of solid industrial diamond. Diamond has the unique property of almost infinite thermal diffusivity at cryogenic temperatures. Indeed, the diamond diffusivity at cryogenic temperatures is approximately 1,000 times greater than that of copper, by way of example. Therefore, the effect of emplacement of the diffuser 64 between the laser 24 and the module 44 is to distribute, virtually instantaneously, the lost or dissipated energy from the lasing process of the laser 24 over a wide area. Diamond has almost zero energy storage at the cryogenic temperatures, this facilitating its function of spreading the energy over a large area of the material of the housing 62 and over the surface of the lithium heat sink 60. Also, the thermal response of diamond is sufficiently fast so as to enable effective cooling of the laser 24 during the interpulse interval following a pulse 20 of the emitted radiation 22. Indeed, there is sufficient extraction of heat during the presence of the radiation pulse 20 so as to allow a greater peak laser output power to be generated without an excessive raising of the temperature of the lasing medium.

The diamond diffuser 64 has the shape of a flat plate which has a thickness of one mm, with a width and a length of 8 mm and 10 mm, respectively. The semiconductor slab of the laser is secured to the diffuser 64 by an indium solder, the solder being disposed in a layer 66 approximately one mil thick. Such thickness of the solder presents a sufficiently short thermal path so as to offer no appreciable impediment to the cooling process. A similar layer 68 of indium solder may be employed for securing the diffuser 64 to the housing 62. The relatively high specific heat of the lithium employed in the heat sink 60, in combination with the high thermal conductivity and low specific heat of the diamond diffuser 64, enable the energy control module 44 to be constructed with a much smaller size and weight than has been possible heretofore.

The use of the lithium heat sink allows a weight reduction, by a factor of seven, over a conventional copper heat sink because of the greater specific heat of the lithium. The cold finger has very thin walls to prevent thermal conduction to the cold finger of ambient heat, and has limited capability to support weight of a large heat sink. The smaller the size of the cooling apparatus, the smaller the weight of a heat sink which can be supported by the cold finger. A reduction in the size of the cooling apparatus, as is provided by the present invention, provides for a large savings in weight and cost. By way of example in the construction of a preferred embodiment of the invention, the laser 24 with its associated electronics weigh approximately 10 pounds, utilize 40 watts of electrical power and produce approximately 16 times the jamming power of previously available arc lamp systems. The collecting optics is less than one inch in diameter. Additional cooling capacity would allow a further increase in jamming power by a factor 4 to 7 times that attained above in the preferred embodiment of the invention.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. Cooling apparatus for withdrawal of heat from a relatively hot object to a relatively cool element, said apparatus including a cold finger, a heat sink thermally connected via said cold finger to said cool element, and a thermal diffuser thermally interconnecting said heat sink with said hot object;

wherein said hot object is a semiconductor laser being operated in a pulsed mode and emitting pulses of thermal energy, the pulses being spaced apart in time;

said heat sink extends beyond a side of said hot object, and said diffuser extends along an interface between said hot object and said heat sink to an extent greater than said side of said hot object to diffuse heat of said hot object over a relatively large region of said heat sink; and said heat sink is constructed of a material having a thermal energy storage capacity greater than a thermal energy storage capacity of material of said cold finger for extraction of heat produced by said laser during generation of a radiation pulse before an occurrence of a following radiation pulse, extracted heat of one radiation pulse being stored in said heat sink during a withdrawal of heat energy from said heat sink via said cold finger to said cool element.

2. Apparatus according to claim 1 wherein said cool element comprises a cryogenic cooler, said heat sink comprises a thermally conductive material of relatively high specific heat and relatively low thermal diffusivity as compared to said diffuser, and said diffuser comprises a thermally conductive material of relatively low specific heat and high thermal diffusivity, thermal energy storage capacity of the material of said heat sink being several times greater than thermal energy storage capacity of the material of said cold finger.

3. Cooling apparatus for withdrawal of heat from a relatively hot object to a relatively cool element, said apparatus including a heat sink thermally connected to said cool element, and a thermal diffuser thermally interconnecting said heat sink with said hot object;

wherein said heat sink extends beyond a side of said hot object, and said diffuser extends along an interface between said hot object and said heat sink to an extent greater than said side of said hot object to diffuse heat of said hot object over a relatively large region of said heat sink;

said cool element comprises a cryogenic cooler, said heat sink comprises a thermally conductive material of relatively high specific heat, and said diffuser comprises a thermally conductive material of relatively low specific heat and high thermal diffusivity; and said thermally conductive material of said heat sink is lithium, and said thermally conductive material of said diffuser is diamond.

4. Apparatus according to claim 3 further comprising a thermally conductive housing enclosing said lithium.

5. Apparatus according to claim 4 wherein said diffuser has the configuration of a plate extending along said interface, the thickness of said plate being approximately one millimeter.

6. Apparatus according to claim 5 further comprising a cold finger extending between said heat sink and said cryogenic cooler to provide a thermally conductive path between said heat sink and said cryogenic cooler.

7. Apparatus according to claim 6 wherein said hot object is a semiconductor laser, said apparatus further comprising a layer of indium solder disposed between said hot object and said diffuser to provide a secured thermally conductive connection between said laser and said diffuser.

8. Apparatus according to claim 7 wherein said solder layer has a thickness of approximately 0.001 inch.

* * * * *